United States Patent [19]

Adleman et al.

[11] 4,212,009

[45] Jul. 8, 1980

[54] SMOOTHING A RASTER DISPLAY

[75] Inventors: George L. Adleman, Brockton; Robert L. Stettiner, Lexington, both of Mass.

[73] Assignee: Hewlett-Packard Company, Palo Alto, Calif.

[21] Appl. No.: 852,176

[22] Filed: Nov. 16, 1977

[51] Int. Cl.² .............................................. G06F 3/14
[52] U.S. Cl. .................................. 340/728; 340/722; 340/744; 340/747
[58] Field of Search ................ 340/324 AD, 720, 722, 340/726, 728, 731, 744, 747; 346/108, 110 R

[56] References Cited

U.S. PATENT DOCUMENTS

| 3,440,480 | 4/1969 | Henderson | 340/324 A |
|---|---|---|---|
| 3,471,847 | 10/1969 | McCollough et al. | 340/324 A |
| 3,968,499 | 7/1976 | Lowe et al. | 346/110 R |

Primary Examiner—Marshall M. Curtis
Attorney, Agent, or Firm—Donald N. Timbie

[57] ABSTRACT

Image forming means are described in which the discontinuities usually occurring in a raster scan display presentation of a waveform are smoothed by varying the width of the path pattern.

12 Claims, 12 Drawing Figures

Fig. 3.

| | (P-3)(P-2)(P-1) | POINT AMPLITUDES | INCREASING WIDTH | DECREASING WIDTH |
|---|---|---|---|---|
| A | | $(P-3) < (P-2) < (P-1)$ | $(P-3)$ TO $(P-2)$ | $(P-2)$ TO $(P-1)$ |
| B | | $(P-3) > (P-2) > (P-1)$ | $(P-1)$ TO $(P-2)$ | $(P-2)$ TO $(P-3)$ |
| C | | $(P-3) < (P-2); (P-2) = (P-1)$ | $(P-3)$ TO $(P-2)$ | $(P-2)$ TO $(P-2)+\Delta$ |
| D | | $(P-1) < (P-2); (P-2) = (P-3)$ | $(P-1)$ TO $(P-2)$ | $(P-2)$ TO $(P-2)+\Delta$ |
| E | | $(P-3) = (P-2); (P-2) < (P-1)$ | $(P-2)\Delta$ TO $(P-2)$ | $(P-2)$ TO $(P-1)$ |
| F | | $(P-1) = (P-2); (P-3) > (P-2)$ | $(P-2)-\Delta$ TO $(P-2)$ | $(P-2)$ TO $(P-3)$ |
| G | | $(P-3) \leq (P-1) < (P-2)$ | $(P-3)$ TO $(P-2)$ | $(P-2)$ TO $(P-2)+\Delta$ |
| H | | $(P-1) \leq (P-3) < (P-2)$ | $(P-1)$ TO $(P-2)$ | $(P-2)$ TO $(P-2)+\Delta$ |
| I | | $(P-2) < (P-1) \leq (P-3)$ | $(P-2)$ TO $(P-3)$ | $(P-3)$ TO $(P-3)+\Delta$ |
| J | | $(P-2) < (P-3) \leq (P-1)$ | $(P-2)$ TO $(P-1)$ | $(P-1)$ TO $(P-1)+\Delta$ |
| K | | $(P-1) = (P-2) = (P-3)$ | $(P-2)\Delta$ TO $(P-2)$ | $(P-2)$ TO $(P-2)+\Delta$ |

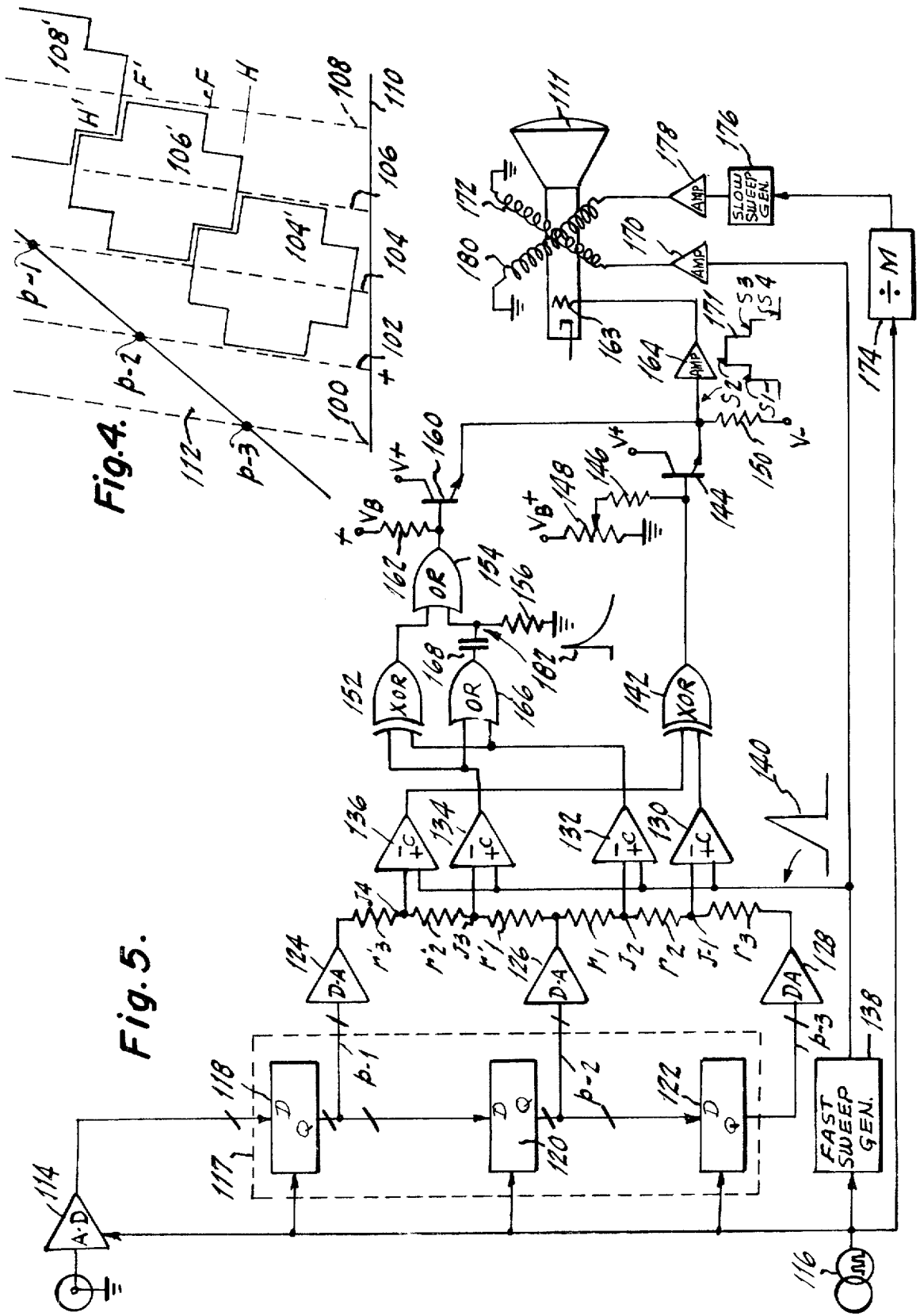

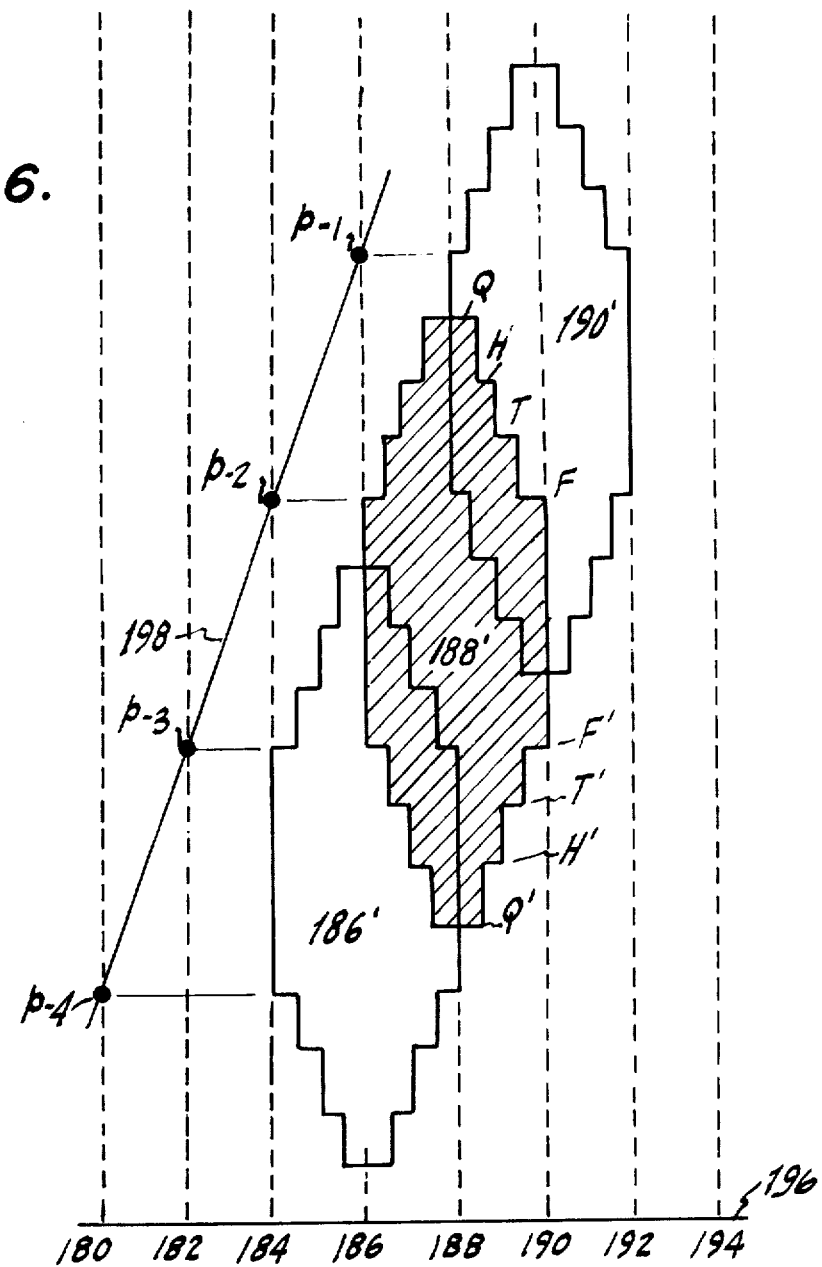

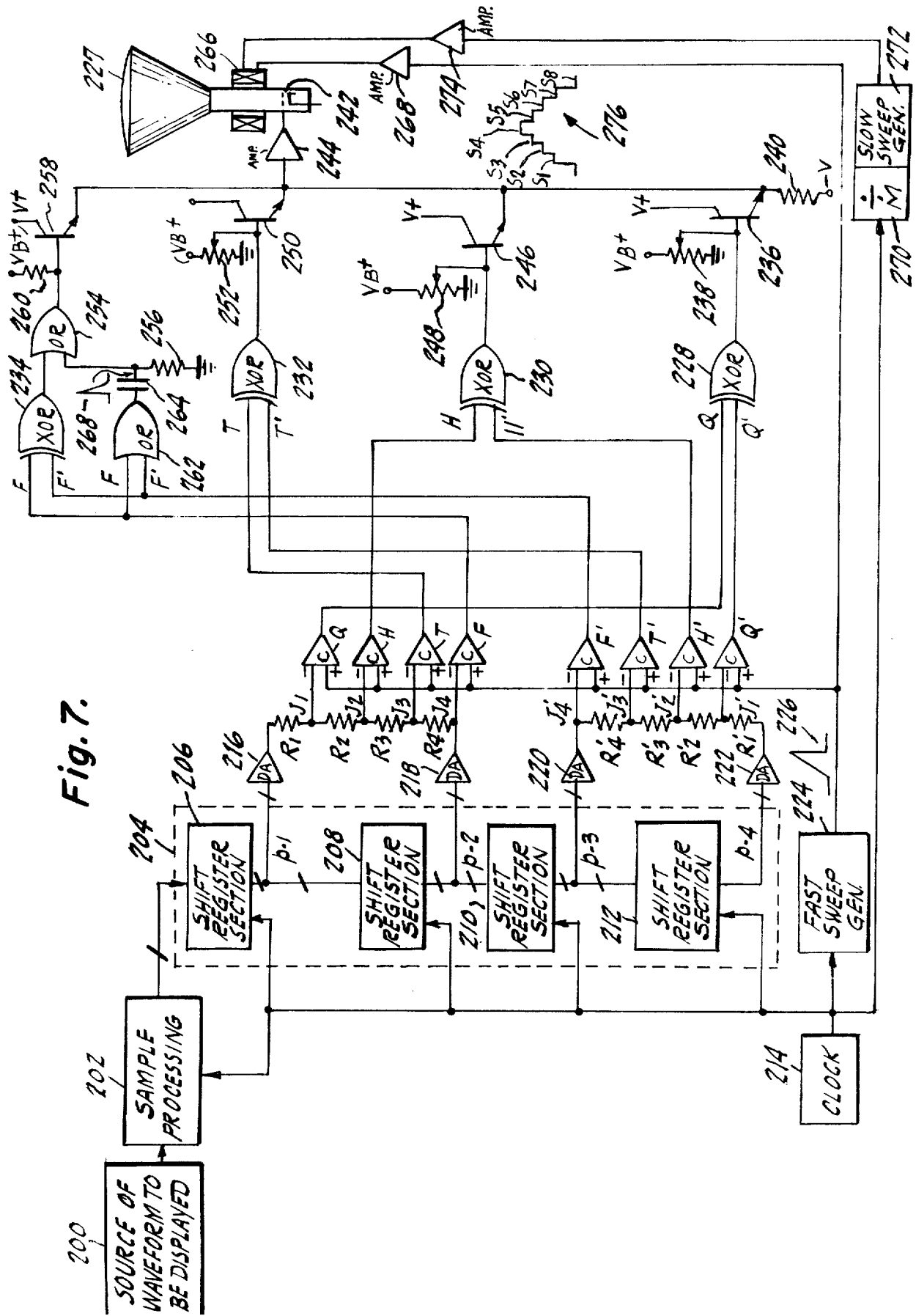

SMOOTHING A RASTER DISPLAY

BACKGROUND OF THE INVENTION

Presenting intermixed waveform, character and graphic information on a single display of a medical monitoring system permits an observer to have essential patient information available at one place and time. Previously directed beam cathode ray tubes have typically been used as the display means for monitoring systems. Presentation of characters and graphics on a directed beam display requires complex, fast deflection circuitry and complex vector drive capability to draw the characters and graphics without losing too much display brightness.

These difficulties may be avoided by using a cathode ray tube in which the electron beam is resonantly deflected so as to scan a raster of parallel paths covering the screen. The time during which the beam is turned off for beam positioning is known and minimal so as to permit filling the display with characters in addition to graphical information without reducing the brightness of the display. When, however, a waveform is reproduced by display systems using a raster scan that forms contrast in light within spaced parallel paths in such a manner that the contrast is changed at points where the waveform intersects the paths, the waveform appears as a series of dots. It can be made to appear as a nearly continuous line if the paths are close enough together, but the expense of producing this fine a raster is prohibitive. Some improvement has been attained with an economical line spacing by elongating the dots along the paths so that one dot does not terminate until the next one begins. This results in a jagged line that may be satisfactory for many applications, but it is not satisfactory for representing certain physiological functions, such as cardiac electrical action, because the jaggedness of the line makes it difficult for the viewer to make an accurate interpretation.

BRIEF DISCUSSION OF THE INVENTION

This invention makes possible the use of a reasonably priced raster display to present graphical information in smooth lines that are free from jaggedness. At the same time, it permits the display of characters without affecting the brightness of other displayed areas. In accordance with this invention, signals are derived representing the amplitudes of the points of intersection of the waveform with at least three successive parallel paths, which may or may not coincide with the raster lines, and utilizing these signals to change the width of a contrast pattern along another parallel path in such manner that the width increases from zero to maximum in a given direction along that path within a range defined by the amplitudes of a first pair of the points and decreases back to zero along the same direction within a range defined by the amplitudes of a second pair of the points. In most cases, the maximum width should be equal to twice the separation between the parallel paths.

The change in width of the contrast pattern along a path can be effected gradually or in steps, with the position of the steps interpolated or representing actual sample values. The first and second pairs of points may be mutually exclusive or have one point in common so that the pattern or shape of the contrast pattern in a path may have a number of variations. If the amplitude range between the first pair of points is greater or less than the amplitude range between the second pair of points, the pattern will be asymmetrical along the path so as to permit a more faithful display of portions of a waveform that have considerable curvature.

Although the changes in a width of a contrast pattern along a path may be effected by a number of means, it has been found satisfactory to use a cathode ray tube in which the electron beam is deflected so as to form a raster of parallel lines and to vary the width of the light emitted in a path by modulating the beam in such manner as to change its spot size and intensity. If the raster lines coincide with the paths, the patterns are formed by modulating the electron beam as it scans through the ranges defined by the amplitudes of the first and second pairs of points. If, however, the raster lines intersect the paths at an angle, the electron beam is made to have an appropriate size whenever it intersects the portion of a path in which part of a contrast pattern is to be formed.

THE DRAWINGS

FIG. 3 is a series of algorithms to be carried out in forming diamond-shaped patterns;

FIG. 4 is a graphic illustration of a portion of a waveform displayed with a three-point two-step contrast pattern;

FIG. 5 is a schematic diagram of a circuit for creating and utilizing the two-step pattern of FIG. 4;

FIG. 6 is a graphic illustration of the manner in which a portion of a waveform may be displayed by a four-point four-step pattern;

FIG. 7 is a schematic diagram of a system for creating and utilizing the four-step contrast pattern of FIG. 6;

THE THREE-POINT DIAMOND PATTERN

Figure 1:
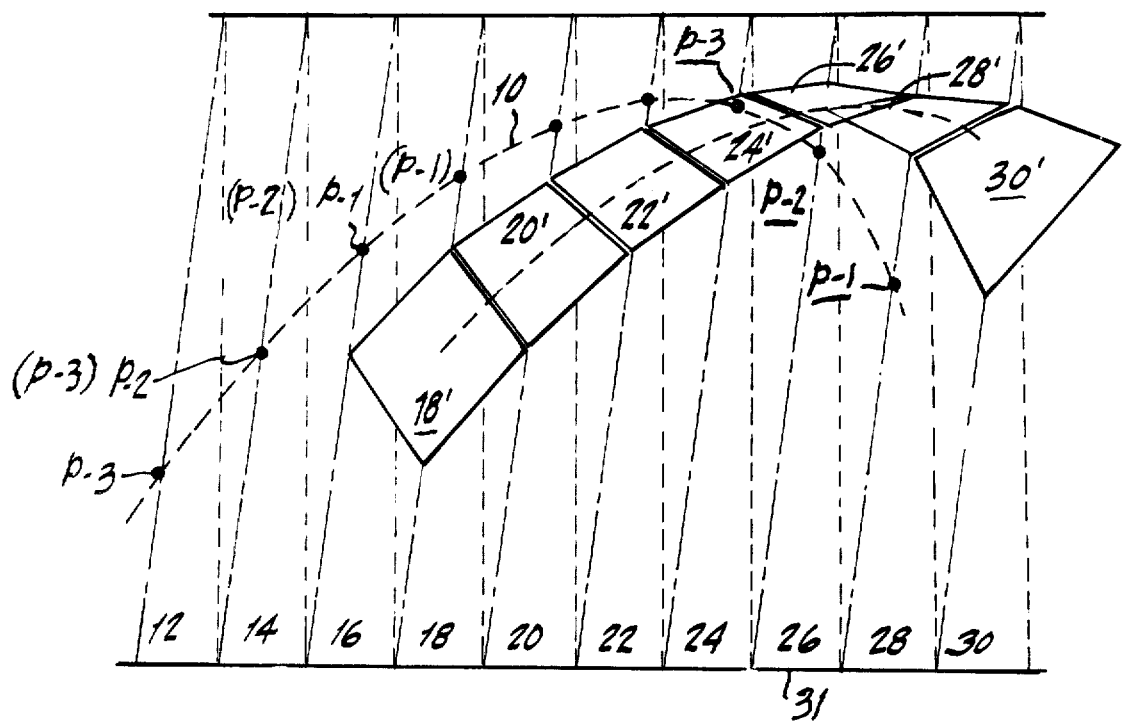
FIG. 1 is a graphic illustration of the manner in which a portion of a waveform may be formed with a diamondshaped contrast pattern.

If a waveform such as 10 of FIG. 1 is displayed by changes in light contrasts at points where it intersects spaced parallel paths such as 12 through 30 that extend upward from a common base 31, it appears as a series of dots, as shown; but, if it is displayed in accordance with the principles of this invention, it may appear as illustrated by the diamond-shaped pattern of light contrast 18' through 30'. The pattern 18' that is centered on a path 18 increases gradually from zero to a maximum width in an upward direction within an amplitude range defined by one pair of points P-3 and P-2 where the waveform 10 intersects the third and second previous paths respectively, and it decreases gradually from the maximum width to zero in an upward direction within an amplitude range defined by a second pair of points P-2 and P-1 where the waveform 10 intersects the second and first previous paths. The diamond pattern 20' is formed along the next parallel path 20, but now the intersections of the waveform 10 with the three previous paths are designated by (P-3), (P-2) and (P-1). The relative amplitudes of the points defining the ranges within which the width of the patterns vary depends on the shape and slope of the portion of a waveform being displayed.

APPARATUS UTILIZING THE DIAMOND PATTERN

Figure 2:
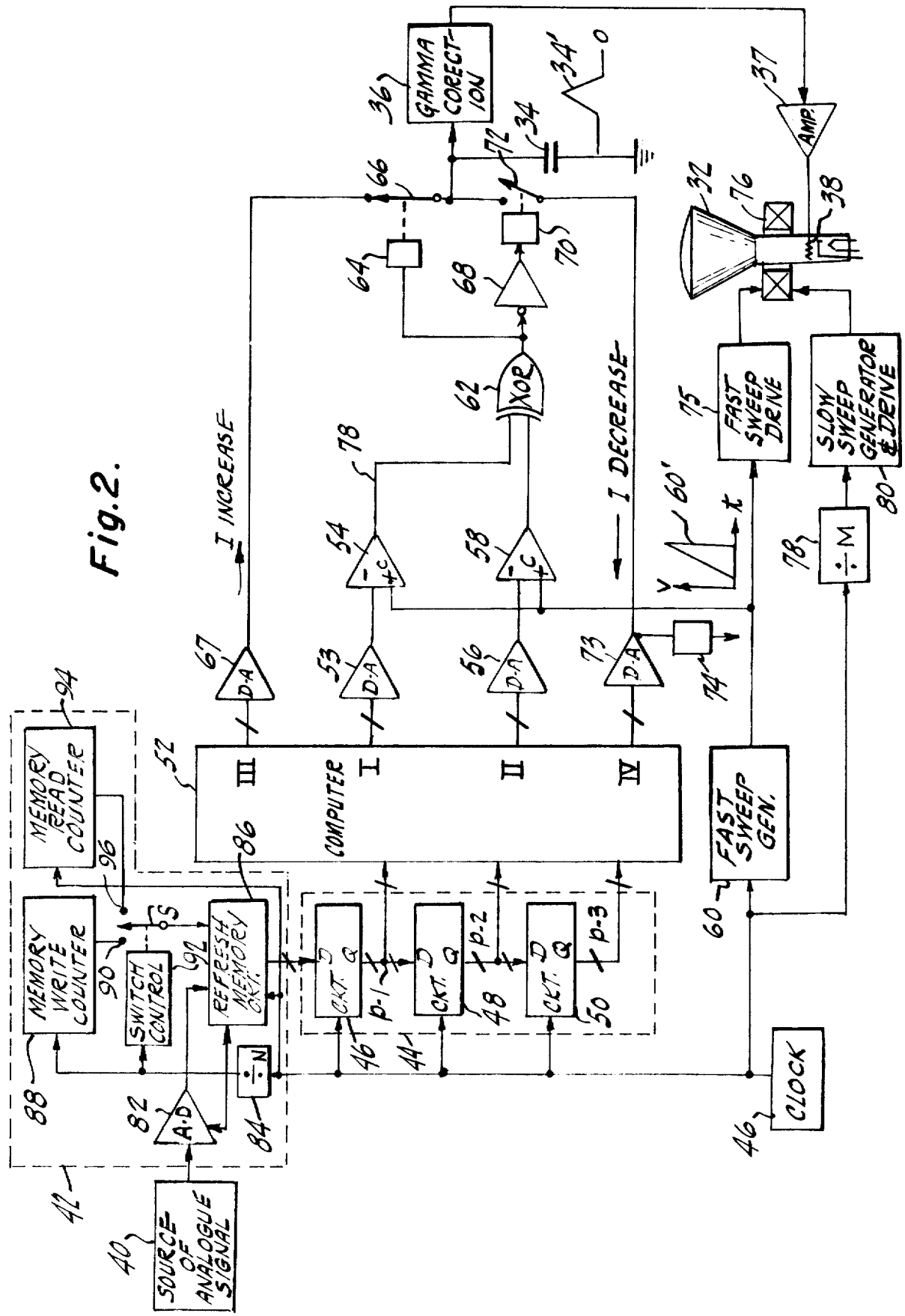
FIG. 2 is a schematic diagram of a circuit for creating and utilizing diamond-shaped patterns in accordance with the algorithms of FIG. 3.

In the system of FIG. 2, the means for displaying the waveform is a cathode ray tube 32 in which the electron beam is deflected so as to scan a raster of spaced parallel lines coinciding with the paths 12 through 30 of FIG. 1. In order to increase and decrease the width of the light emitted along a line of the raster, as is required to form the diamond patterns, the control of the electron beam is increased and decreased in such manner as to change the size of the beam at the face of the cathode ray tube. In this particular embodiment, this is done by charging and discharging a capacitor 34 and applying the voltage waveform 34' appearing across it via a suitable CRT gamma correction circuit 36 and an amplifier 37 to a beam control electrode such as control grid 38 of the cathode ray tube 32. In producing the diamond pattern 18' of FIG. 1, for example, the voltage waveform 34' increases from zero to a maximum value as the electron beam scans along the line 18 between amplitudes corresponding to the amplitudes of intersection points P-3 and P-2 and decreases back to zero as the electron beam scans farther along the line 18 between amplitudes corresponding to the amplitudes of the intersection points P-2 and P-1. The charging and discharging of the capacitor 34 may be accomplished as follows.

The waveform to be displayed is coupled from a source 40 to a digital amplitude sampling means 42 having its output connected to a shift register 44. A system clock 46 supplies pulses of fast scanning frequency to synchronize the sampling means 42 and the shift register 44, so that the outputs of the shift register sections 46, 48 and 50 respectively represent the amplitudes of the waveform at the last three raster lines, e.g., P-3, P-2 and P-1. These signals are applied to a computer 52 that is programmed in accordance with the algorithms of FIG. 3 so as to provide a digital signal at an output I corresponding to the smallest amplitude represented by the sample signals which, in the case of scanning along the path 18 of FIG. 1, would be the amplitude of the intersection point P-3. The computer 52 also provides at an output II a digital signal corresponding to the intermediate amplitude represented by the sample signals which, in the case of path 18, would be the amplitude of the intersection point P-2. The computer output I is connected to a D-A converter 53, and its voltage output is connected to the inverting input of a comparator 54. The computer output II is connected to a D-A converter 56, and its voltage output is connected to the inverting input of a comparator 58. A line sweep generator 60 that is synchronized with pulses from the system clock 46 provides a sawtooth voltage wave 60' that varies from zero to a maximum value during each line scanning interval. The voltage 60' is applied to the non-inverting inputs of the comparators 54 and 58.

The outputs of the comparators 54 and 58 are respectively connected to the inputs of an XOR 62. Its output is connected to a switch actuating means 64 for semiconductor switch 66 and also via an inverter 68 to a switch actuating means 70 for semiconductor switch 72. The switch 66 is connected via a D-A converter 67 between the ungrounded side of the capacitor 34 and an output III of the computer 52 at which the computer provides a calculated value of constant charging current. The switch 72 is connected via a D-A converter 73 between the ungrounded side of the capacitor 34 and an output IV of the computer 52 at which the computer supplies a calculated value of discharge current. A clamp circuit 74 prevents the output of the D-A converter 73 from going below the initial voltage level.

Deflection of the electron beam in the cathode ray tube 32 is produced by applying the sawtooth voltage wave 60' at the output of the line sweep generator 60 to a fast sweep drive circuit 75 that, in turn, is coupled to a deflection means 76. Slow or raster scanning is achieved by connecting a frequency divider 78 between the clock 46 and a slow sweep generator and drive means 80 that is coupled to the deflection means 76.

OPERATION

The circuit shown in FIG. 2 operates as follows. At the beginning of a raster line, the output of the comparators 54 and 58 and the XOR 62 are in a low state, the switch 66 is open and the switch 72 is closed. When the sawtooth voltage wave 60' reaches a voltage equal to that at the inverting input of the comparator 54 which corresponds to the amplitudes of the lowest of the intersection points P-1, P-2 and P-3, the comparator 54 and the XOR 62 change to a high state so as to cause the switch 72 to open and the switch 66 to close, thereby starting the charge of the capacitor 34. The rate of charge depends on the constant charging current value provided at the output III. This value is calculated to be inversely proportional to the difference in amplitude between the intersection point having the least amplitude and the intersection point having the intermediate amplitude. When the sawtooth voltage 60' reaches a voltage equal to that at the inverting input of the comparator 58 which corresponds to the amplitude of the intermediate intersection point, the comparator 58 also changes to a high state so as to cause the switch 66 to open and the switch 72 to close, thereby starting the discharging of the capacitor 34. The rate of discharge depends on the constant discharging current value provided at the output IV. The value is calculated to be inversely proportional to the difference in amplitude between the intersection pont having the intermediate amplitude and the intersection point having the largest amplitude.

The capacitor 34 and the portion of the apparatus just described that charges the capacitor constitute means responsive to a first pair of sample signals for developing a first set of control signals (the rising portion of the waveform 34') that are adapted to increase the width of a change in contrast of the light produced along a given direction on a parallel path within an amplitude range defined by the amplitudes represented by the first pair of sample signals. In the case of the pattern 18' on the path 18, the pair of sample signals are those representing the amplitudes of the intersection points P-3 and P-2.

The capacitor 34 and the portion of the apparatus just described that discharges the capacitor 34 constitute means responsive to a second pair of sample signals for developing a second set of control signals (the descending portion of the waveform 34') that are adapted to decrease the width of a change in contrast of the light produced along the same parallel path within an amplitude range defined by the amplitudes represented by a second pair of control signals. In the case of the pattern 18' on the path 18, the second pair of sample signals are those representing the amplitudes of the intersection points P-2 and P-1. In this particular case, the first and second sets of control signals are continuous so as to modulate the width of the electron beam as it scans along a raster line coinciding with one of the paths 12 through 30 described.

The algorithms of FIG. 3 show the ranges for the increase and decrease in width of the light contrast patterns for all variations of the relative amplitudes of the points P-3, P-2 and P-1 at which the waveform to be displayed intersects the three previous paths. Inasmuch as some of the variations, such as those of rows C, D, E, F, G, H, I and J, might require the full charge or discharge of the capacitor 34 to take place in zero time, the computer 52 causes the charge or discharge current to be a fixed amount and times the opening and closing of the switches 66 and 72 accordingly. The variations in rows G, H, I and J could be displayed by widening the electron beam as it goes through the amplitude range defined by the two lower points and narrowing it as it goes through a range defined by the upper two points, but better fits between the diamond patterns are achieved by using the changes in width called for by the algorithms. Row K shows a finite small charge and discharge time required to indicate where the waveform has equal value (a horizontal line). Without this indicator, the line would become invisible.

SAMPLE PROCESSOR

In most instances, signals representing physiological functions take much more time to complete a cycle than it takes for the electron beam to scan a complete raster, e.g., it takes about one second for the heart to complete a cycle, but during this time, the beam of the cathode ray tube may have scanned sixty complete rasters. If no special techniques are employed, one-sixtieth of a heart cycle would be displayed during each raster scan so that, in one second, the entire heart cycle would be displayed in sixty overlapping different parts. Such a display would be meaningless. Increasing the time it takes to scan one raster to one second would mean that one entire heart cycle could be sequentially displayed across the screen, but because the light emitted by the phosphor on the face of the cathode ray tube decays rapidly, most of the first part of the heart cycle would be invisible by the time the last part is being formed. In order to present a uniformly bright display of one or more complete cycles of a slowly varying signal, like that representing a heartbeat, it has been suggested that samples of the signal amplitude be taken at a slow rate and displayed many times at a fast rate during the slow input time.

In the system of FIG. 2, a "bright scan" technique is carried out in the following way. The analog signal to be displayed, which may be the voltage output of an ECG machine, is supplied by the source 40 to the sample processing circuit 42. It is comprised of an A-D converter 82 which is activated by each pulse received from a frequency divider 84 to produce a digital word representing the amplitude of the signal at that time. The output of the converter is connected to a data input of a refresh memory 86. A refresh memory write address counter 88 supplies the write address to a terminal 90 of a solid state single-pole double-throw switch S having its contact arm connected to the address input of the memory 86. Pulses from the frequency divider 84 are also applied to the write input of the memory 86, the clock input of the address counter 88, and a switch control means 92 for actuating the "arm" of the switch S into contact with the terminal 90. Thus, in response to each pulse from the divider 84, a new digital word is entered into consecutive addresses of the refresh memory 86.

The memory read address is supplied by a refresh memory read address counter 94 that is connected to the other terminal 96 of the switch S. The address control signals are such as to read the memory 86 repeatedly with the same sequence taht the digital signals were written. Pulses from the system clock 46 are applied to the divider 84, the clock terminal of the memory 86, and the clock terminal of the read address counter 94. The output of the refresh memory 86 is applied to the input of the shift register 44. This "bright display" refresh system previously designed for directed beam displays is compatible with this raster display system.

THE THREE-POINT TWO-STEP PATTERN

In FIG. 4, spaced parallel paths are indicated by dotted lines 100, 102, 104, 106 and 108 extending upward from a common base line 110. A waveform 112 that intersects the paths 100, 102 and 104 at points P-3, P-2 and P-1 respectively is displayed by the cross-shaped patterns 104', 106' and 108'. In particular, the pattern 106' changes from zero width to half-width at an amplitude H that is at one-third of the amplitude range between the points P-3 and P-2, and it changes to full or maximum width at an amplitude F that is two-thirds of this range. The width of the pattern changes from full to half-width at an amplitude F' that is one-third of the amplitude range between the points P-2 and P-1, and it changes to zero width at an amplitude H' that is two-thirds of this range.

APPARATUS UTILIZING A THREE-POINT TWO-STEP PATTERN

If the electron beam of a cathode ray tube 111 in FIG. 5 is deflected so as to form a raster containing parallel lines that coincide with the paths 100 through 108 of FIG. 4, the patterns can be formed by modulating the width of the beam with control signals generated in the following way. The waveform to be displayed is applied to an A-D converter 114 that samples the amplitude of the waveform once each raster line under the control of pulses of raster line scanning frequency applied to it from a system clock 116. If desired, a "bright scan" circuit, such as described in connection with FIG. 2, can be used, but in the circuit as shown, the output of the A-D converter 114 is applied directly to a shift register 117 having three sections 118, 120 and 122. These sections are controlled by pulses from the clock 116, so that their outputs are digital sample signals representing the amplitudes of the waveform to be displayed at the last three raster line intervals, such as at the points P-3, P-2 and P-1 of FIG. 4. These digital sample signals are converted to corresponding voltages by converters 124, 126 and 128. Resistors $r_1'$, $r_2'$ and $r_3'$ are connected between the output of the D-A converter 126 and the output of the converter 124, and resistors $r_1$, $r_2$ and $r_3$ are connected between the output of the D-A converter 126 and the output of the converter 128. All resistors have the same value, so that the voltage at the junction $J_1$ of the resistors $r_2$ and $r_3$, and the voltage at the junction $J_2$ of the resistors $r_1$ and $r_2$ have values that are respectively one-third and two-thirds of the voltage between the output of the D-A converter 128 and the output of the converter 126. The voltage at the junction $J_3$ of the resistors $r_1'$ and $r_2'$ and the voltage at the junction $J_4$ of the resistors $r_2'$ and $r_3'$ are respectively one-third and two-thirds of the voltage between the output of the D-A converter 126 and the output of the D-A converter 124. These junctions $J_1$, $J_2$, $J_3$ and $J_4$ are respectively connected to the inverting inputs of the voltage comparators 130, 132, 134 and 136. A sweep generator 138 that is synchronized by pulses from the clock 116 supplies a sawtooth voltage wave 140 of line scanning frequency to the non-inverting inputs of the voltage comparators 130, 132, 134 and 136.

The subsequent logic circuits produce sets of beam width control signals that increase the width of the beam in the cathode ray tube in response to one pair of sample signals and decrease the width of the beam in response to another pair of sample signals. The outputs of comparators 130 and 136 are connected to the inputs of an XOR 142. Its open collector output is connected to the base of a transistor 144 and to the arm of a potentiometer 148 via resistor 146. An emitter load resistor 150 is connected between a point of negative voltage $V-$ and the emitter of the transistor. The outputs of the voltage comparators 132 and 134 are connected to the inputs of an XOR 152 and the inputs of an OR 166. The XOR 152 output is connected to one input of an OR 154. The other input of the OR 154 is connected to ground by a resistor 156 and is coupled by capacitor 168 to the output of OR 166. The open collector output of the OR 154 is connected to the base of a transistor 160 and to a point of positive voltage +VB by a resistor 162. The emitter of the transistor is connected to the emitter of the transistor 144. These emitters are coupled via an amplifier 164 to an electron beam width control electrode of the cathode ray tube 111, such as the control grid 163, by an amplifier 164.

Deflection of the beam of the cathode ray tube 111 along the lines of the raster is attained by applying the sawtooth voltage wave 140 to an amplifier 170 and connecting its output to a line deflection coil 172. Raster deflection is attained by connecting a frequency divider 174 between the clock 116 and a raster sweep circuit 176 and connecting its output via an amplifier 178 to a raster deflection coil 180.

OPERATION OF FIG. 5

If the waveform 112 of FIG. 4 is applied to the A-D converter 114 of FIG. 5, the voltages at the resistor junctions $J_1$, $J_2$, $J_3$ and $J_4$ respectively correspond to the amplitudes of H, F, F' and H' shown in FIG. 4. At the start of a line when the sawtooth voltage wave 140 is zero, all of the logic device outputs are in a low state, and the transistors 144 and 160 follow the logic output voltage minus a $V_{be}$ drop which is applied to the resistor 150 to cut off the electron beam in the cathode ray tube 111.

When the sawtooth voltage wave 140 reaches the voltage at $J_1$, the voltage comparator 130 changes to a high state and causes the open collector output of the XOR 142 to rise to a value determined by the setting of potentiometer 148. The emitter-follower transistor 144 emitter rises to a voltage indicated by the step $s_1$ in waveform 171. When the sawtooth voltage 140 reaches the voltage at the junction $J_2$, the voltage comparator 132 and the XOR 152 change to a high state. This causes the open collector output of the OR 154 to rise to a positive voltage determined by the +VB that is higher than the voltage of the step $s_1$. The emitter-follower transistor 160 emitter rises to a voltage indicated by step $s_2$ in the waveform 171. The emitter-follower 144 is cut off. When the voltage of the step $s_1$ is applied to the amplifier 164, the voltage applied to the grid 163 of the cathode ray tube 111 is sufficient to cause the electron beam of the cathode ray tube to have half the maximum width, as indicated at H in FIG. 4, and when the voltage of the step $s_2$ is applied to the amplifier 164, the beam is made to have the maximum width, as indicated at F of FIG. 4. Thus, the circuits just described develop a first set of control signals $s_1$ and $s_2$ in response to a first pair of sample signals at the points P-3 and P-2 that increase the width of the light along a path, such as 106 of FIG. 4, within an amplitude range defined by the pair of sample signals.

When the sawtooth voltage wave 140 reaches the voltage at $J_3$, the output of the XOR 152 and of the OR 154 revert to a low state. This turns off the emitter-follower 160 and causes the voltage at the input of the amplifier 164 to drop, as indicated by the step $s_3$ of the waveform 171, so as to be equal to the voltage of $s_1$ that is determined by the emitter-follower 144. This voltage reduces the beam of the cathode ray tube 111 to half the maximum width, as indicated at F' of FIG. 4. Finally, as the sawtooth voltage 140 reaches the voltage at $J_4$, the comparator 136 and the XOR 142 revert to a low state, turning off the emitter-follower transistor 144 and reducing the voltage at the input of the amplifier 164 to zero, as indicated by the step $s_4$ of the waveform 171. The electron beam now has cut off, as indicated at H' in FIG. 4. Thus, the circuits just described develop a second set of control signals $s_3$ and $s_4$ in response to a second pair of sample signals at points P-2 and P-1 that decrease the width of the light along a path, such as 106 of FIG. 4, within an amplitude range defined by the second pair of sample signals.

If a portion of the waveform being reproduced is horizontal so as to intersect paths of FIG. 4 at the same amplitude, the values of the sample signals at the points P-3, P-2 and P-1 would be the same, so that the voltages applied to the inverting inputs of the comparators 130, 132, 134 and 136 would have the same value. Therefore, when the sawtooth voltage wave 140 applied to the non-inverting inputs reaches this value, all comparators change to a high state at the same time. When this occurs, neither XOR 142 nor XOR 152 changes state, so that the electron beam never turns on at a point when it should have maximum width. The beam is turned on in this situation by operation of the OR 166. When the first of its inputs goes high, it produces a high-going edge that is differentiated by the capacitor 168 and the resistor 156 so as to form a short pulse 182 across the resistor 156 that causes the OR 154 to change to a high state and turn on the beam of the cathode ray tube 111.

It will be appreciated that the number of steps in the sets of control signals can be increased by using more resistors between the output of the converters and providing more comparators and XORs and/or increasing the number of sample points utilized for each shape. If enough steps are used, the pattern produced could be, from a practical point of view, the same as the diamond pattern previously described.

THE FOUR-POINT FOUR-STEP PATTERN

In FIG. 6, a plurality of spaced parallel paths are indicated by dotted lines 180, 182, 184, 186, 188, 190, 192 and 194 that extend upwardly from a base line 196. A waveform 198 that respectively intersects the paths 180, 182, 184 and 186 at points P-4, P-3, P-2 and P-1 is displayed by light patterns 186', 188' and 190' extending along the paths 186, 188 and 190 respectively. The width of the cross-hatched pattern 188' increases in four equal steps from zero to a maximum within an amplitude range defined by the points P-4 and P-3. For the amplitude range defined by the points P-3 and P-2, the width remains at a maximum value that is preferably equal to twice the space between adjacent parallel paths, and within an amplitude range defined by the points P-2 and P-1, the width of the pattern decreases from maximum to zero in four equal steps. The patterns 186' and 190' are the same manner so there is some overlap.

APPARATUS UTILIZING A FOUR-POINT FOUR-STEP PATTERN

If the display means includes a cathode ray tube having raster lines that coincide with the paths 180 through 194 of FIG. 6, the pattern shown therein can be formed by controlling the width of the electron beam as it scans along each raster line in accordance with the location of the points P-4, P-3, P-2 and P-1 at which the waveform to be displayed intersects the four previous raster lines. In the system of FIG. 7, the digital signals at the output of a source 200 are applied to a sample processing means 202 which may be a "bright scan" circuit, such as described in connection with FIG. 1. The output of the sample processing means is applied to a shift register 204 having four sections 206, 208, 210 and 212 that are activated to advance the digital word in response to each pulse applied to the clock inputs from a system clock 214. After the shift register has been loaded, the digital words at the outputs of the shift register sections 206, 208, 210 and 212 are a group of sample signals that respectively represent the amplitudes of the waveform to be displayed at the last four successive paths, as indicated at the points P-4, P-3, P-2 and P-1 shown in FIG. 6. These sample signals are respectively applied to the inputs of D-A converters 216, 218, 220 and 222 that produce voltages having corresponding amplitudes. These voltages can also be regarded as a group of signals that simultaneously and respectively represent the amplitude of the waveform to be reproduced at four successive lines of the raster.

Four equal resistors $R_1$, $R_2$, $R_3$, and $R_4$ are connected in the order named between the outputs of the D-A converters 216 and 218, and the junctions $J_1$, $J_2$, $J_3$ and $J_4$ are respectively connected to the inverting inputs of voltage comparators Q, H, T and F. Four equal resistors $R_1'$, $R_2'$, $R_3'$ and $R_4'$ are connected in the order named between the outputs of the D-A converters 222 and 220, and the junctions $J_1'$, $J_2'$, $J_3'$ and $J_4'$ are respectively connected to the inverting inputs of voltage comparators Q', H', T' and F'. A fast or line sweep generator 224 that is synchronized by pulses from the clock 214 supplies a line frequency sawtooth voltage wave 226 to the non-inverting inputs of all the voltage comparators.

The following logic circuits provide a set of electron beam width control signals for increasing the width of the electron beam in a cathode ray tube 227 in response to one of the pairs of sample signals P-4 and P-3 or P-2 and P-1 as the beam scans along a path and a set of control signals for decreasing the width of the electron beam in response to the other of these pairs of sample signals as the beam scans farther along the path. The outputs of the comparators Q and Q' are applied to the respective inputs of an XOR 228; the outputs of comparators H and H' are applied to the respective inputs of the XOR 230; the outputs of the comparators T and T' are applied to the respective inputs of the XOR 232; and the outputs of the comparators F and F' are applied to the respective inputs of the XOR 234 and the inputs of the OR 262. The open collector output of the XOR 228 is connected to the base of a transistor 236 and to the arm of a potentiometer 238. The emitter of the transistor 236 is connected via an emitter load resistor 240 to a point of negative voltage V- to cut off the electron beam in the cathode ray tube 227 when it is applied to its control grid 242 via an amplifier 244. The open collector output of the XOR 230 is connected to the base of a transistor 246 and to the arm of a potentiometer 248. The emitter of the transistor 246 is connected to the resistor 240. The open collector output of the XOR device 232 is connected to the base of a transistor 250 and to the arm of a potentiometer 252. The emitter of the transistor 250 is connected to the resistor 240. The output of the XOR 234 is connected to one input of an OR 254, the other OR 254 input being connected to ground by a resistor 256, and is coupled by capacitor 264 to the output of OR 262. The open collector output of the OR 254 is connected to the base of a transistor 258 and to a point of positive voltage by a resistor 260. The emitter of the transistor 258 is connected to the resistor 240.

Deflection for the electron beam of the cathode ray tube 227 at line frequency is attained by coupling the sawtooth wave 226 at the output of the fast sweep generator 224 to a deflection means 266 via an amplifier 268. Raster deflection of the beam is attained by coupling pulses from the clock 214 to a frequency divider 270 and synchronizing a slow sweep generator 272 with the low frequency pulses from the divider 270. The output of the generator 271 is coupled to the deflection means 266 via an amplifier 274.

OPERATION OF FIG. 7

The operation of the system of FIG. 7 will be understood by examining the manner in which it functions to form the pattern 188' of FIG. 6. Within an amplitude range defined by the points P-4 and P-3, the width of the pattern increases from zero in 25% steps, as indicated by the letters Q', H', T' and F'; within an amplitude range as defined by the points P-3 and P-2, it remains at full width; and within an amplitude range defined by the points P-2 and P-1, it decreases in 25% steps to zero. The voltage at the outputs of the D-A converters 216, 218, 220 and 222 are proportioned to the amplitudes of the points P-1, P-2, P-3 and P-4, so that the voltages at the junctions $J_1$, $J_2$, $J_3$, $J_4$, $J_4'$, $J_3'$, $J_2'$ and $J_1'$ respectively correspond to the amplitudes of Q, H, T, F, F', T', H' and Q' of FIG. 6.

At the beginning of a raster line when the sawtooth voltage wave 226 is zero, all of the logic device outputs are in a low state. When the sawtooth voltage wave 226 has a voltage equal to that at the junction $J_1'$, the voltage comparator Q' changes to a high state, causing the output of the XOR 228 to increase to a value determined by the voltage provided by the potentiometer 238. The voltage is set so that the transistor 236 produces a signal indicated by step $s_1$ of a waveform 276. As the sawtooth voltage successively equals the voltages at the junctions $J_2'$ and $J_3'$, the comparators H' and T' successively change to a high state, causing the open collector outputs of the XORs 230 and 232 to rise to potentials determined by the settings of the potentiometers 248 and 252. These potentials are such as to respectively cause their emitters to rise to the voltages indicated by the signals $s_2'$ and $s_3'$ of the waveform 276. When the sawtooth wave 226 rises to the voltage at $J_4'$, the voltage comparator F' changes to a high state, causing the XOR 234 to change to a high state and the output of the OR 254 to rise to a voltage determined by the voltage +VB at the upper end of the resistor 260. This voltage is such as to produce a voltage at the emitter of the transistor 258 that is indicated by the signal $s_4'$ of the waveform 276. The signals $s_1$, $s_2$, $s_3$ and $s_4$ cause the electron beam of the cathode ray tube 227 to have 25%, 50%, 75% and 100% respectively of the maximum width. This set of signals causes the width of the beam to increase within an amplitude range determined by a pair of sample signals which, in this particular example, are the sample signals at the points P-4 and P-3. As the sawtooth voltage wave 226 successively rises to voltages at the junctions $J_4$, $J_3$, $J_2$ and $J_1$, the voltage comparators F, T, H and Q respectively change to a high state and cause the XORs 228, 230, 232 and the OR 254 to revert to a low state and produce signals $s_4$, $s_3$, $s_2$ and $s_1$ of the waveform 276. This set of signals causes the width of the beam to decrease within an amplitude range determined by a pair of sample signals which, in this particular example, are the sample signals at the points P-2 and P-1.

The OR 262 operates in cooperation with the capacitor 264 and the resistor 256 to produce a pulse 268 that produces a minimum width pulse at the output of the OR 254 whenever the two middle points have the same amplitude.

It will be appreciated that the numbers of steps could be increased by increasing the number of resistors connected between the outputs of the pair of D-A converters 216 and 218 and the pair of D-A converters 220 and 222. The number of voltage comparators would also be increased, as well as the number of XORs.

PREFERRED APPARATUS UTILIZING A FOUR-POINT FOUR-STEP PATTERN

When the waveform to be displayed has a reversal of direction within four paths so that there is an overlap between the ranges defined by the amplitudes of the points P-4 and P-3 with the range defined by the amplitudes of the points P-2 and P-1, there exists the possibility of there being gaps in the otherwise smooth continuous line of the display produced by the circuit of FIG. 7.

Figure 8:
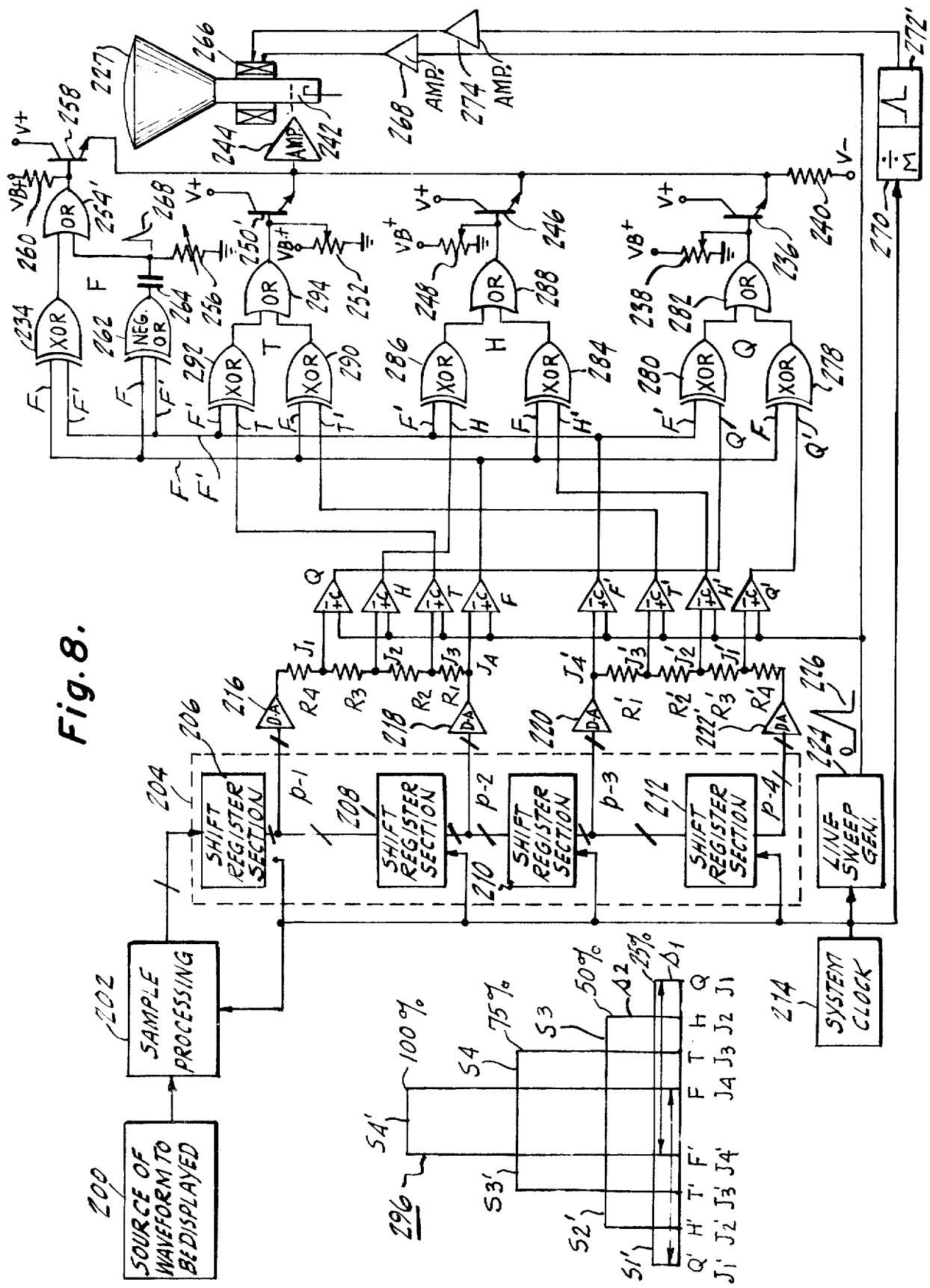
FIG. 8 is a schematic diagram of a system incorporating a preferred form of the invention for producing the four-step contrast pattern shown in FIG. 6.

In the system shown in FIG. 8, however, gaps are generally not produced. Most of the components are the same as in FIG. 7 and are indicated by the same letters or numerals. The difference is that two XOR devices having their outputs coupled to inputs of an OR device are substituted for the XORs 228, 230 and 232 of FIG. 7. Thus, the outputs of a pair of XORs 278 and 280 are respectively coupled to the inputs of an OR 282 having its output connected to the base of the transistor 236; the outputs of a pair of XORs 284 and 286 are respectively coupled to the inputs of an OR 288 having its output connected to the base of the transistor 246; and the outputs of a pair of XORs 290 and 292 are respectively coupled to the inputs of an OR 294 having its output connected to the base of the transistor 250. The following table shows the comparators that are respectively coupled to the inputs of the various XORs.

| XOR | 278 | 280 | 284 | 286 | 290 | 292 | 234 | 262 |
|---|---|---|---|---|---|---|---|---|
| COMPARATORS TO WHICH XOR INPUTS ARE CONNECTED | FQ' | F'Q | FH' | F'H | FT' | F'T | F'F | F'F |

OPERATION OF FIG. 8

In displaying a sloped line, such as 198 of FIG. 6, the system of FIG. 8 operates very much like the system of FIG. 7. When, for example, the comparator Q' changes state, the OR 282 changes to a high state so as to produce the step $s_1'$ in the graphical representation 296. The OR 282 remains in a high state until the comparator Q changes state, at which point it reverts to a low state so as to form the step $s_1$. The fact that the comparators F and F' connected to the inputs of the XORs 278 and 280 have changed state in the meantime has no effect, as the OR 282 remains in a high state as long as the two inputs to the XOR 278 or the two inputs to XOR 280 are not the same. Thus, as the sawtooth wave 226 rises, the ORs 282, 288, 290 and 254 change to a high state so as to produce the voltage steps $s_1'$, $s_2'$, $s_3'$ and $s_4'$ which constitute a set of control signals produced in response to a pair of sample signals representing the amplitudes of the pair of intersection points P-4 and P-3. This set of control signals may be used to successively increase the width of the light contrast pattern along the given direction within an amplitude range defined by the amplitudes represented by the pair of sample signals.

In the circuit of FIG. 7, there is the possibility that there will be a space between the amplitude range in which the comparators Q and Q' change to a high state so as to produce the steps $s_1$ and $s_1'$ and the amplitude range in which the comparators H and H' change to a high state so as to produce the steps $s_2$ and $s_2'$. If this occurs, the beam will have zero width in the space between the ranges so as to produce a gap in the display of the waveform. In the circuit of FIG. 8, however, the changes in state of one of the comparators Q and Q' causes the beam to produce a step $s_1'$, so as to increase the width of the beam to 25% of maximum, but the change in state of the other of these comparators does not produce a step $s_1$ so as to decrease the width of the beam back to zero unless both comparators F and F' have changed state. Thus, no gap is produced in the portions of the range between P-4 to P-3 that overlaps the range between P-2 to P-1.

DIGITALIZED CIRCUITS FOR FIGS. 7 AND 8

Figure 9:
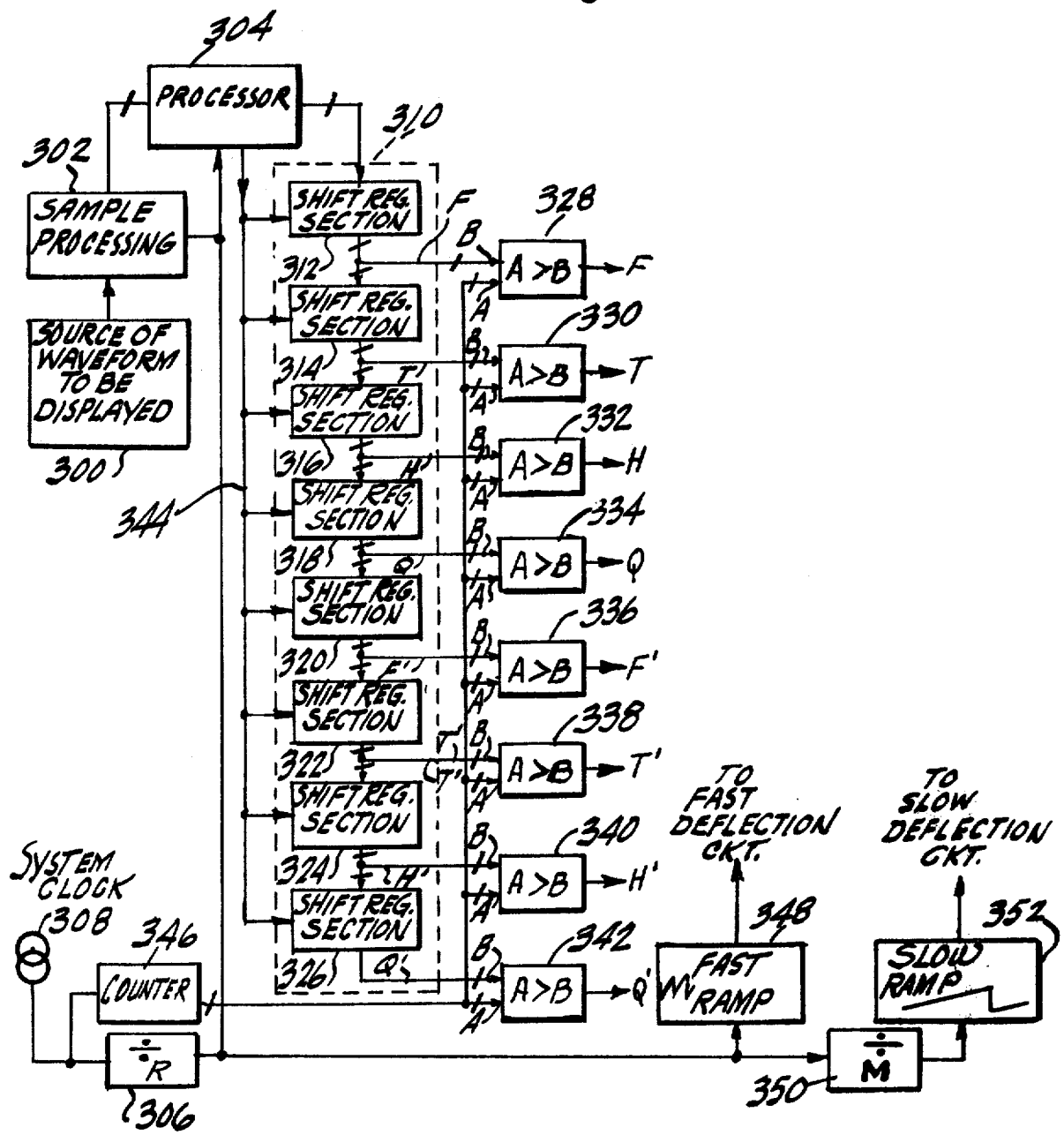
FIG. 9 is a block diagram illustrating a way in which digital circuits with a programmed processor may be used in the systems of FIGS. 7 and 8.

FIG. 9 illustrates the use of digital circuits to provide the inputs to the logic circuits of either FIG. 7 or FIG. 8. The waveform to be displayed is supplied by a source 300 to a sample processing means 302, and its output is applied to a processor 304. The sample processing means 302 and the processor 304 are synchronized with pulses of line scanning frequency supplied by a frequency divider 306 that is connected to a system clock 308. After sample signals representing the amplitude of the wave being displayed at four successive lines of the raster, e.g., the amplitudes of the points P-4, P-3, P-2 and P-1 of FIG. 6, have been applied to the processor 304, it calculates the amplitudes at which the various steps in the pattern occur. In this particular example, the digital words representing these amplitudes are supplied to a shift register 310 from the output of the processor in the order Q', H', T', F', Q, H, T and F so as to appear in that order at the outputs of the shift register sections 312, 314, 316, 318, 320, 322, 324 and 326. These outputs are respectively connected to the B inputs of digital magnitude comparators 328, 330, 332, 334, 336, 338, 340 and 342. The calculations for one line may be done during the previous line and are inputted to the shift register during the blanking period just before the line in which they are to be used. The required advance of the shift register sections is controlled by pulses supplied by the processor 304.

A counter 346, driven by pulses from the system clock 308, supplies digital words corresponding to different increasing amplitudes in a repeated sequence to the A inputs of the magnitude comparators 328 through 342. Each sequence occurs during a line scansion, and the number of digital words in a line depends on the number by which the divider 306 divides, because its output synchronizes the fast or line ramp generator 348 that controls the line deflection rate of the cathode ray tube (not shown). A frequency divider 350 is coupled between the frequency divider 306 and a slow or raster ramp generator 352 that controls the raster deflection of the cathode ray tube. Whenever the digital word supplied to the A input of one of the comparators 328 through 342 represents an amplitude equal to or greater than the amplitude represented by the digital word supplied to its B input from one of the sections of the shift register 310, the output of the comparator changes from a low to a high state. Therefore, if the outputs of the magnitude comparators corresponding to Q', H', T', F', Q, H, T and F are substituted for the outputs of the comparators in FIGS. 7 and 8 that are designated in the same way, the system of FIGS. 7 and 8 will operate as previously explained.

Figure 10:
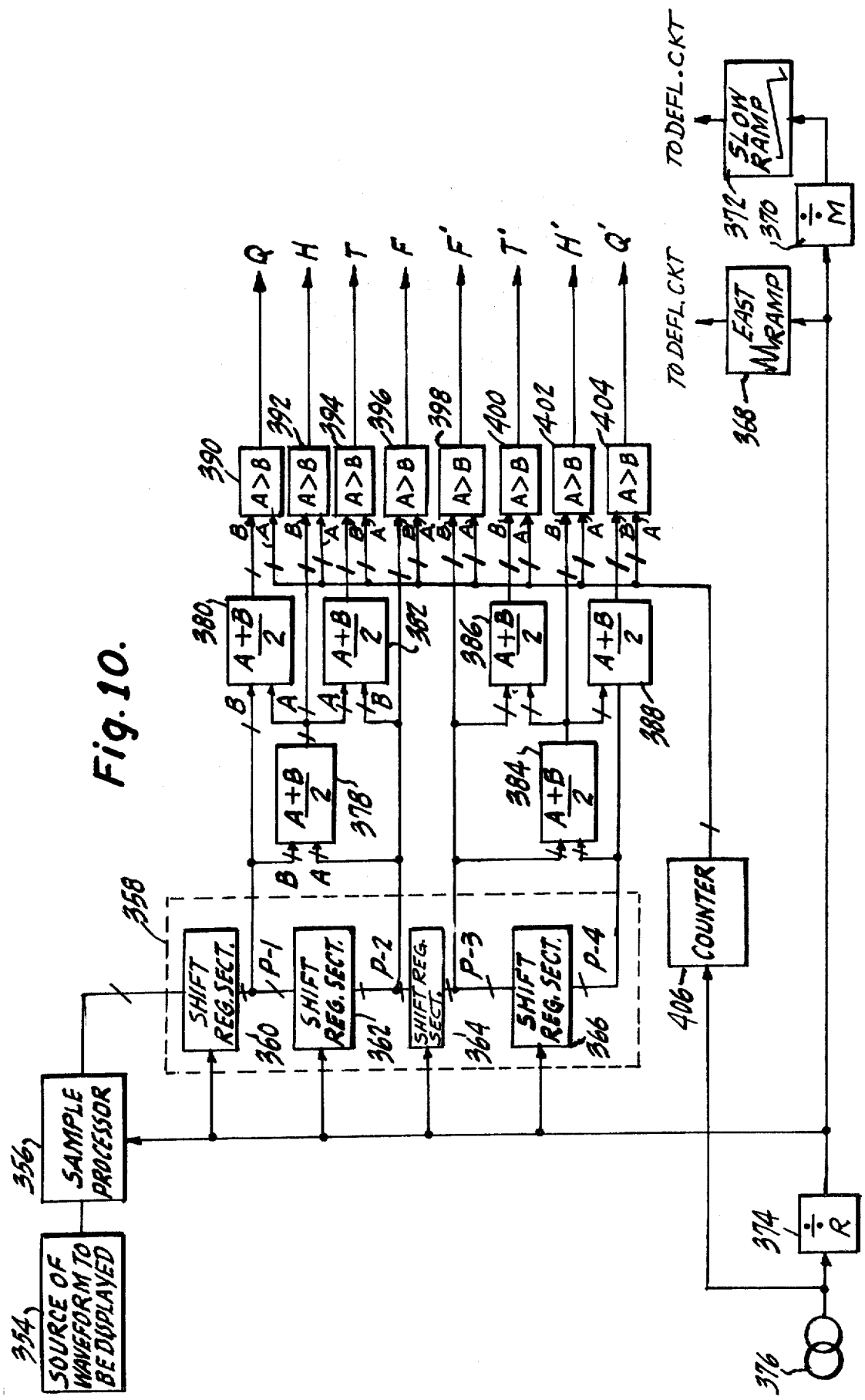
FIG. 10 is a block diagram illustrating one way in which digital logic circuits may be used to replace the analog functions in the systems of FIGS. 7 and 8.

FIG. 10 shows digital circuits that are the counterpart of the analog circuits of FIGS. 7 and 8 for deriving signals that inform the logic circuits as to when the electron beam in the cathode ray tube has reached amplitudes corresponding to the points Q, H, T, F, F', T', H' and Q' that are required to form the four-step patterns illustrated in FIG. 6.

The waveform to be displayed is supplied by a source 354 to a sample processor 356 like the one used in FIGS. 7 and 8, and its output is applied to a shift register 358 having four sections 360, 362, 364 and 366. Raster line frequency synchronizing pulses for the shift register sections, the sample processor 356, a fast ramp deflection generator 368, and a divider 370 that supplies synchronizing pulses to a slow ramp deflection generator 372 are supplied by a frequency divider 374 that is driven by a system clock 376.

The inputs of a digital averaging means 378 are connected to the outputs of the shift register sections 360 and 362 so as to produce a digital signal representing the half-amplitude H between the amplitudes of the points P-1 and P-2. A digital signal representing the quarter-amplitude Q is derived at the output of a digital averaging means 380 by respectively connecting its inputs to the output of the shift register section 360 and the output of the averaging means 378. A digital signal representing the three-quarter amplitude T is derived at the output of a digital averaging means 382 by respectively connecting its inputs to the output of the shift register section 362 and to the output of the averaging means 378. A digital signal F representing the full amplitude difference between P-1 and P-2 is obtained directly from the output of the shift register section 362 where the signal representing the amplitude of P-2 appears. Signals representing the amplitudes of the points F', T', H' and Q' are derived in a similar manner. The output of the shift register section 364' represents the amplitude F'. The signal representing the half-amplitude H' between the amplitudes of P-3 and P-4 is derived by a digital averaging means 384 having its inputs connected to the outputs of the shift register sections 364 and 366. The signal representing the three-quarter amplitude T' between P-4 and P-3 is derived at the output of a digital averaging means 386 having its inputs respectively connected to the outputs of the shift register section 364 and the output of the averaging means 384. The signal representing the one-quarter amplitude Q' between P-4 and P-3 is derived at the output of a digital averaging means 388 which has its inputs respectively connected to the output of the shift register section 366 and the output of the digital averaging means 384.

The outputs of the digital averaging means 380, 378 and 382, the shift register section 362, the shift register section 364, and the digital averaging means 386, 384 and 388 are respectively applied to the B inputs of magnitude comparators 390, 392, 394, 396, 398, 400, 402 and 404. The output of a counter 406, that is driven by the system clock 376, is connected to the A inputs of the magnitude comparators. During each line scansion, the counter 406 outputs a series of digital words that successively represent greater amplitudes. When the amplitude exceeds that represented by a digital word applied to the B input of a digital comparator, its output changes from a low to a high state, so that the outputs of the magnitude comparators 390 through 404 can be substituted for the outputs of the comparators Q, H, T, F, F', T', H', and Q' of FIGS. 7 and 8.

APPARATUS IN WHICH RASTER LINES ARE NOT COINCIDENT WITH THE PATHS

Figure 11:
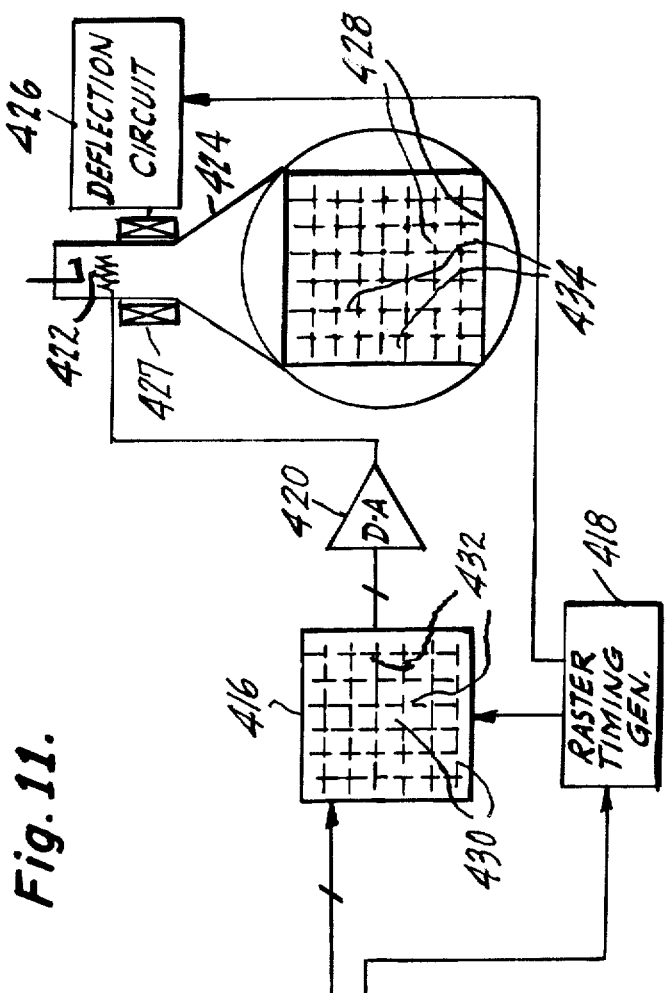
FIG. 11 illustrates a system incorporating the invention in which the raster lines of a cathode ray tube intersect the paths along which the patterns are formed at a right angle.

In the apparatus discussed thus far, the raster lines on the face of a cathode ray tube have coincided with the spaced parallel paths along which light is emitted, so that the diamond light contrast patterns of FIG. 1, the two-step light contrast patterns of FIG. 4, and the four-step light contrast patterns of FIG. 6 have been formed by modulating the width of the electron beam as it scans along each raster line within the ranges defined by the amplitudes at which the waveform being displayed intersects previous raster lines. In FIG. 11, the patterns are formed on the face of a cathode ray tube in which the raster lines intersect the spaced parallel paths rather than coinciding with them.

In the system of FIG. 11, the waveform to be displayed is supplied by a source 410 to the input of an A-D converter 412 that periodically samples the amplitude of the waveform and applies the digital words representing the amplitude of each sample to a computer 414. As each digital sample word is received, the computer 414 calculates from it and the preceding sample words the width that the light contrast pattern is to have at the intersections of a path with the raster lines that occur between the lowest and highest amplitude represented by the samples. If seven different widths (and off) are to be used, the computer outputs a three-bit word representing the width at each intersection. Each of the words are stored at memory locations in the memory 416 corresponding to the display intersections. The stored words are read out of memory 416 sequentially under the control of a raster timing generator 418 and applied to a D-A converter 420. Its voltage output is applied to a beam width control electrode, such as a control grid 422 of a cathode ray tube 424. The raster timing generator 418 also controls a deflection circuit 426 that drives deflection coils 427 for the cathode ray tube 424 in such manner that its electron beam scans a raster of parallel lines 428 in synchronism with the reading of words in the memory locations along corresponding parallel lines 430 of the memory 416. The words in each row of the memory are at the intersections of vertical dotted lines 432 that correspond to vertical dotted lines 434 on the face of the cathode ray tube 424. As each word is read out of the memory 416, the voltage at the output of the D-A converter 420 has a value determined by that word. Thus, the output of the D-A converter 420 is a series of pulses of different amplitudes, each of which occurs at an intersection of the electron beam in the cathode ray tube 424 with the vertical dotted lines 434. The width of the electron beam at each intersection depends on the amplitude of the pulse occuring at the time. The dotted lines 434 are the spaced parallel paths along which the contrast of light is to be effected in order to form the particular patterns to be used. The loci of these paths are determined by the location of the words in the memory 416 rather than by the loci of the raster lines. The computer 414 supplies pulses to the A-D converter 412 to control the sampling rate and to the raster timing generator 418 to synchronize it.

OPERATION OF FIG. 11

Figure 11A:
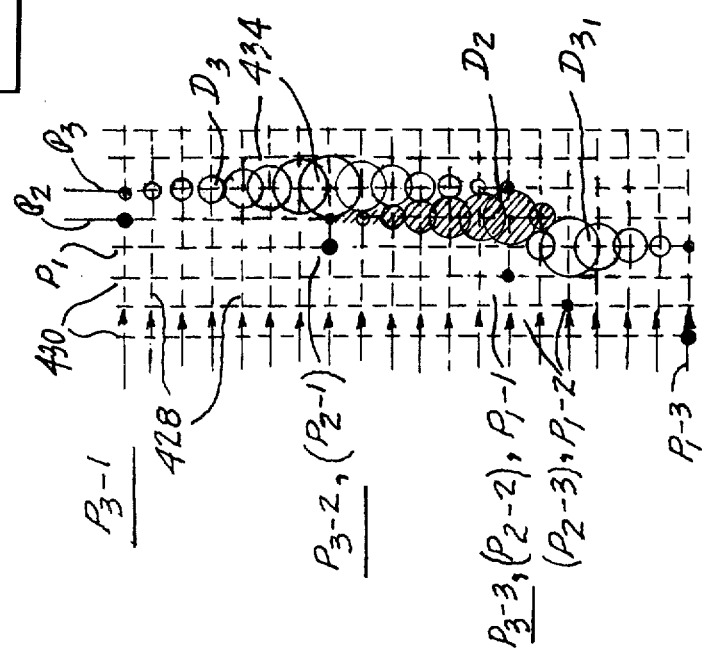
FIG. 11A is a graph used in explaining the operation of the systems of FIG. 11.

Although the system of FIG. 11 can be used to form light contrast patterns of any shape, the manner in which it operates to produce diamond patterns will now be explained with the aid of FIG. 11A, which shows the loci of a few of the paths 430 and a few of the raster lines 428 on the face of the cathode ray tube 424. The electron beam scans along the lines 428 in sequence in a direction indicated by the arrows. It is turned on for the duration of the pulses from the D-A converter 420 from a time just before it reaches path 434 until a time just after, to any intensity and therefore width, determined by the amplitude of the pulses and indicated by the diameter of the circles. The diamond pattern $D_1$ is formed along a path $p_1$ by proportionally increasing the diameter of the beam at the intersections of the path p with raster lines between the points $P_1$-3 and $P_1$-2 and proportionally decreasing the diameter of the beam at the intersection of this path $p_1$ with raster lines between the points $P_1$-2 and $P_1$-1. The shaded diamond pattern $D_2$ is formed along the next path $p_2$ by proportionally increasing the diameter of the beam at intersections of the path $p_2$ and the raster lines between the points $(P_2$-3$)$ and $(P_2$-2$)$ and proportionally decreasing the diameter of the beam at the intersections of the path $p_2$ with the raster lines between the points $(P_2$-2$)$ and $P_2$-1$)$. Similarly, the diamond pattern $D_3$ is formed along the path $p_3$ by proportionally increasing the diameter of the beam at intersections of the path $p_3$ and the raster lines between the points $p_3$-3 and $P_3$-2 and proportionally decreasing the diameter of the beam at the intersection of the path $p_3$ with the raster lines between the points $p_3$-2 and $P_3$-1.

SUMMARY

In the embodiments of the invention in which the raster lines of the cathode ray tube are the paths along which the patterns are formed, the signals of the first set that successively increase the width of the contrast pattern and the signals of the second set that successively decrease the width of the contrast pattern must occur in sequence as the beam is scanning along the raster line or path, but when, as in FIG. 11, the raster lines intersect the path, the signals in the first and second sets of signals occur a line scanning interval apart. The signal for any intersection is the same in either case, but the time of occurrence differs. In either case, a signal calling for a particular width at a particular point along a path must be available to control the spot size of the electron beam when it arrives at that point, whether it is scanning along the path or transverse to it. This can be accomplished by hardware circuits, as shown in FIGS. 2, 5, 7, 8 and 10, or by software and a computer, as shown in FIG. 11.

What is claimed is:

1. Apparatus for developing control signals that may be used with a display means to change the width of a pattern of light contrast along parallel paths in such manner that the display means may display a waveform intersecting said parallel paths in the form of a smooth line, said means for developing control signals comprising sampling means responsive to a waveform to be displayed for successively producing sample signals, each sample signal representing the amplitude of the intersection of the waveform to be displayed with a different one of a plurality of adjacent paths, first means responsive to a first pair of said sample signals for developing a first set of control signals that can be used for increasing the width of the pattern of contrast in light produced along a given direction of a parallel path within an amplitude range defined by the amplitudes represented by said first pair of sample signals, and second means responsive to a second pair of said sample signals for developing a second set of control signals that can be used for decreasing the width of the pattern of contrast in light produced along said given direction of said path within an amplitude range defined by the amplitudes represented by said second pair of sample signals.

2. Apparatus as set forth in claim 1 wherein said first and second means operate to respectively derive sets of control signals for effecting the change in width of the pattern in steps along said paths.

3. Apparatus as set forth in claim 1 wherein said first and second means operate to respectively derive sets of control signals for effecting the changes in width of the pattern smoothly along said paths.

4. Apparatus as set forth in claim 1 wherein said display means includes a cathode ray tube, means for deflecting the beam of said cathode ray tube along lines parallel to said parallel paths, and means for changing the width of the spot produced by the said cathode ray beam as it scans along a line of the raster in response to said first and second sets of control signals.

5. Apparatus for reproducing a waveform on a cathode ray tube in which the beam is deflected to form a raster of parallel lines comprising means for producing and making simultaneously available at least three sample signals representing the amplitude that the waveform to be reproduced is to have at successive raster line intervals, means responsive to said sample signals for increasing the width of said electron beam as it scans along a line of the raster within a range between the lowest amplitude represented by the sample signals and an intermediate amplitude represented by the sample signals, and means responsive to said sample signals for decreasing the width of said electron beam as it continues to scan along this same line of the raster within a range between an intermediate amplitude represented by said sample signals and the highest amplitude represented by said sample signals.

6. Apparatus as set forth in claim 5 wherein said means for increasing the width of the electron beam and the means for decreasing the width of the electron beam both operate to change the width of the beam in steps.

7. Apparatus as set forth in claim 5 wherein said means for increasing the width of the electron beam and the means for decreasing the width of the electron beam both operate to change the width of the beam smoothly.

8. In apparatus for displaying waveforms on a cathode ray tube in which the beam is deflected to form a raster of parallel lines, the combination of sampling means responsive to the waveform for making simultaneously available three signals, each representing the amplitude that the waveform is to have at successive raster line intervals, an integrator, means for applying a signal to said integrator to cause its output to change in one direction during the portion of a line scansion of the raster that corresponds to the amplitude range between the lowest of the amplitudes represented by said three signals and the intermediate amplitude represented by them, and means for applying a signal to said integrator to cause its output to change in the opposite direction during the portion of the same line scansion of the raster that corresponds to the amplitude range between the intermediate amplitude represented by said signals and the highest amplitude represented by said signals, whereby a beam width control voltage is developed across at the output of said integrator for causing a cathode ray tube to form diamond-shaped patterns along the lines of the raster.

9. Apparatus for displaying a signal comprising
a cathode ray tube,
means for deflecting the electron beam of said cathode ray tube so that it scans a raster of parallel lines on the face thereof,
means for sampling a signal to be displayed so as to produce a sample signal representing the amplitude of the signal to be displayed at each raster line scanning interval,
means responsive to a pair of said sample signals for widening the electron beam as it scans along each line of the raster through at least a portion of an amplitude range defined by a first pair of consecutive sample signals that were produced during a first pair of previous raster lines, and
means responsive to another pair of said sample signals for narrowing the electron beam as it scans farther along each line of the raster through at least a portion of an amplitude range defined by sample signals that were produced during a second pair of previous raster lines.

10. Apparatus for displaying a waveform on the face of a cathode ray tube, comprising means for producing sample signals representing the distances from a given axis at which the waveform is to intersect each of a succession of equally spaced parallel paths intersecting that axis, means for deflecting the beam of said cathode ray tube so that it scans a raster of parallel lines, means responsive to a pair of said sample signals for increasing the size of the spot formed on the face of said cathode ray tube by the cathode ray beam when it is at successive points along a given direction of parallel paths within an amplitude range defined by a first pair of said sample signals, and means responsive to another pair of said sample signals for decreasing the size of the spot formed on the face of said cathode ray tube by the cathode ray beam when it is at successive points along said given direction within an amplitude range defined by a second pair of said sample signals.

11. Apparatus for displaying a signal as a waveform in which amplitude is measured along a first axis and time is measured along a second axis that is perpendicular to the first, comprising means for sampling the signal to be displayed when the signal is applied to it so as to derive sample signals representing the amplitude of the signal at successive instants of time, light contrast control means responsive to a set of control signals for varying the width of light contrast along parallel paths, the paths having a predetermined angle with respect to said first and second axes, means responsive to a first pair of consecutive sample signals for deriving and applying a first set of control signals to said light contrast control means for causing it to vary the width of the light contrast in one sense in a given direction along a path within a range determined by the intersections with said path by perpendiculars from points corresponding to said first pair of sample signals, and means responsive to a second and later pair of consecutive sample signals for deriving and applying a second set of control signals to said light contrast control means for causing it to vary the width of the light contrast in the opposite sense in a direction along said path within a range determined by the intersections with said path by perpendiculars from points corresponding to said second pair of sample signals.

12. Apparatus for displaying a waveform representing a signal that varies in amplitude with time, comprising sampling means for producing at its output sample signals representing the amplitude of said signal at successive instants of time when said signal is applied to its input, a shift register having an input coupled to said output of said sampling means, said shift register having a plurality of outputs at which signals respectively representing the amplitudes of successive sample signals simultaneously appear, first dividing means having inputs coupled to a first pair of outputs of said shift register for producing signals at different outputs representing predetermined fractions of the amplitudes represented by the signals at said first pair of outputs, second dividing means having inputs coupled to a second pair of outputs of said shift register for producing signals at different outputs representing corresponding fractions of the amplitudes represented by the signals at said second pair of outputs, a plurality of comparators, each having one input coupled to a different one of the outputs of said first and second dividing means, and having an output, means for generating a sawtooth wave, a cathode ray tube having means for producing a cathode ray beam and a beam intensity control electrode, means for deflecting the beam of said cathode ray tube in a raster of parallel lines in synchronism with said sawtooth voltage wave, means coupling the sawtooth voltage wave at the output of said generating means to the other inputs of said comparators, whereby the voltage at their outputs changes state when said sawtooth voltage wave reaches a voltage equal to that applied to inputs from the outputs of said first and second dividing means, a first control signal generating means coupled to the outputs of a first pair of comparators to which like fractions of the output of the first and second dividing means are applied, said control signal generating means producing a control signal of a first amplitude when the outputs of said first pair of comparators are both in a low state, a control signal of a second amplitude when the output of only one of said first pair of comparators is in a high state and a control signal of the first amplitude when the outputs of said first pair of comparators are both in a high state, a second control signal generating means coupled to the outputs of a second pair of comparators to which like but different fractions of the outputs of said first and second control signal generating means producing a control signal of a third amplitude, greater than said second amplitude, when only one of said second pair of comparators is in a high state, and means for applying said control signals to said beam intensity control electrode of said cathode ray tube so as to vary the width of the beam.

* * * * *